United States Patent
Steinbrecher (10) Patent No.: US 10,468,782 B1
(45) Date of Patent: Nov. 5, 2019

(54) METHOD FOR DETERMINING THE INSTANTANEOUS POLARIZATION OF PROPAGATING ELECTROMAGNETIC WAVES

(71) Applicant: The United States of America as represented by the Secretary of the Navy, Newport, RI (US)

(72) Inventor: Donald H Steinbrecher, Brookline, MA (US)

(73) Assignee: The United States of America as represented by the Secretary of the Navy

(*) Notice: Subject to any disclaimer, the term of this patent is extended or adjusted under 35 U.S.C. 154(b) by 0 days.

(21) Appl. No.: 16/384,971

(22) Filed: Apr. 16, 2019

(51) Int. Cl.
| | |
|---|---|
| *H01Q 21/00* | (2006.01) |
| *H01Q 21/06* | (2006.01) |
| *H01Q 17/00* | (2006.01) |
| *G01S 3/32* | (2006.01) |
| *G01R 29/08* | (2006.01) |
| *G01S 3/74* | (2006.01) |
| *H01Q 23/00* | (2006.01) |

(52) U.S. Cl.
CPC ....... *H01Q 21/061* (2013.01); *G01R 29/0892* (2013.01); *G01S 3/32* (2013.01); *G01S 3/74* (2013.01); *H01Q 17/00* (2013.01); *H01Q 23/00* (2013.01)

(58) Field of Classification Search
CPC ...... H01Q 21/061; H01Q 23/00; H01Q 17/00; H01R 1/02; H01R 29/0892
USPC .......................................................... 343/703
See application file for complete search history.

(56) References Cited

U.S. PATENT DOCUMENTS

| | | | | |
|---|---|---|---|---|
| 5,724,666 A * | 3/1998 | Dent | ...... | H01Q 1/246 455/562.1 |
| 6,151,310 A * | 11/2000 | Dent | ...... | H01Q 1/246 370/330 |
| 6,201,801 B1 * | 3/2001 | Dent | ...... | H01Q 1/246 370/342 |
| 6,349,095 B1 * | 2/2002 | Hugenberg | ...... | H04N 7/14 348/E7.077 |
| 6,553,239 B1 * | 4/2003 | Langston | ...... | H04W 16/24 455/562.1 |
| 2017/0234916 A1 * | 8/2017 | Lawlis | ...... | G01R 29/0892 701/34.4 |
| 2018/0060203 A1 * | 3/2018 | Gupta | ...... | G06F 11/3442 |

* cited by examiner

*Primary Examiner* — Huedung X Mancuso
(74) *Attorney, Agent, or Firm* — James M. Kasischke; Michael P. Stanley (57) ABSTRACT

A method is provided for determining instantaneous polarization of multiple electromagnetic transmissions. A segmented aperture system determines a direction of arrival of a transmission based on port coordinates and the geometric relationship of the segments. The ports receive at least two orthogonal polarizations that characterize the incoming signals. Two angles are calculated by a simultaneous solution of two phase difference measurements to determine the direction of arrival. A mean direction of arrival solution is obtained by averaging solution estimates that are obtained by repeating the direction of arrival determination.

4 Claims, 9 Drawing Sheets

METHOD FOR DETERMINING THE INSTANTANEOUS POLARIZATION OF PROPAGATING ELECTROMAGNETIC WAVES

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION

(1) Field of the Invention

The present invention is a method for monitoring the instantaneous polarization of multiple wireless electromagnetic signals in a wide bandwidth.

(2) Description of the Prior Art

A polarization modulation technique is disclosed in U.S. Pat. No. 2,992,427, which describes a system in which digital information is transmitted to two enabling AND gates with another input being a microwave carrier signal. The AND gates are alternately enabled, one of the keyed signals being transmitted with one type of polarization and the other of the keyed signals being transmitted with a different type of polarization. At the receiving location, one keyed signal is received by an antenna responsive only to the first type of polarization, and the other keyed signal is received by an antenna responsive only to the other type of polarization. In this way, a single carrier frequency may be used to transmit two binary data signals.

Other polarization modulation techniques using conventional antennas are known. Some polarization modulation techniques attempt to improve security by incorporating more than one polarization modulated carrier in a method similar to Orthogonal Frequency Division Modulation (OFDM).

A method for analyzing the instantaneous polarization of an electromagnetic signal is taught by Steinbrecher (U.S. Pat. No. 7,250,920); incorporated herein by reference. The method utilizes a planar surface, illustrated in FIG. 1, FIG. 2, FIG. 3 and FIG. 4, that acts as an antenna to capture the polarization of incident electromagnetic radio frequency signals.

In the figures, partition elements 2 resolve the polarization vector of an incident electromagnetic wave into two orthogonal vector components respectively aligned with the X-Axis and the Y-Axis of a planar distribution surface. The planar distribution surface is also known as an Eplane 4. Radio frequency ports 6 located horizontally and vertically between the partition elements 2 capture the instantaneous scalar polarization energy of incident electromagnetic signals aligned with the X-Axis and the Y-Axis of the Eplane 4.

A first electromagnetic signal air interface is a planar array of linearly polarized wireless sensors. Each sensor has a radio frequency port with a defined phase center. A first subarray of radio frequency ports 6 is aligned with the X-Axis of the Eplane 4. The first subarray of RF ports 6 are each labeled 'X-pol' to indicate that the radio frequency ports collect the polarization vector component aligned with the X-Axis of the Eplane 4.

Each radio frequency port of a second subarray of radio frequency ports 6 is aligned with the Y-Axis of the Eplane 4. The second subarray of radio frequency ports 6 are each labeled 'Y-pol' to indicate that the ports collect the polarization vector component that is aligned with the Y-Axis of the Eplane 4. If the number of radio frequency ports 6 in each array is equal to or greater than four; then each array can function as a direction of arrival system in which two angles defining the arrival are evaluated by a signal processing algorithm described in Steinbrecher (U.S. Pat. No. 10,001,542).

The direction of linear polarization of the first air interface defines the X-Axis of a polarization plane. The X-Axis component of instantaneous polarization of each arriving signal is the vector dot product of the signal polarization vector and an X-Axis vector. The vector dot product is a vector operation that computes the projection of a vector in a specified direction.

The polarization vector is projected onto the X-Axis and the Y-Axis to determine the X and Y components of the vector. The X component is designated the 'X-pol' component and the result of the direction of arrival (DOA) analysis is designated as the 'X-pol-DOA'.

A second electromagnetic signal air interface is a planar array of linearly polarized wireless sensors. Each sensor has a radio frequency port with a defined phase center. If the number of active radio frequency ports is four or greater; then the array can function as a direction of arrival system in which two angles defining the direction of arrival are processed with an algorithm.

The direction of linear polarization of the second air interface defines the Y-Axis of a polarization plane. The Y-Axis component of instantaneous polarization of each arriving signal is the vector dot product of the signal polarization vector and the Y-Axis vector. The Y component is designated the 'Y-pol' component and the result of the direction of arrival analysis is designated as the 'Y-pol-DOA'.

A first linearly polarized electromagnetic signal air interface, designated the 'X-pol-AI', and a second linearly polarized electromagnetic signal air interface, designated the 'Y-pol-AI' can be co-located or spatially separate provided that the linear polarizations of the two air interfaces are orthogonal to the received signals of interest. The X-pol-AI and the Y-pol-AI may be identical, except for name and orientation, and arranged in the same plane with orthogonal linear polarizations that define the X-Axis and the Y-Axis of a polarization plane.

It is assumed that the location of the first air interface and the location of the second air interface are arranged so that the wireless electromagnetic signal illumination intensity is the same for both air interfaces. This illumination intensity is possible when the signal source is in the far field.

A planar partitioned air interface wideband antenna is further taught by Steinbrecher (U.S. Pat. No. 9,094,081) and by Steinbrecher (U.S. Pat. No. 9,602,143) with both patents incorporated herein by reference. The "White Nail" partitioned air interface (described in the Steinbrecher patents) resolves the polarization of incident electromagnetic waves into two orthogonally polarized independent apertures. Thus, the instantaneous polarization vector associated with a radio frequency signal captured by the partitioned air interface can be resolved by two scalar magnitudes of vector components that are aligned with the orthogonal coordinates-identified as 'X' and 'Y' of the partitioned air interface.

By using a radio direction of arrival method as taught by U.S. Pat. No. 10,001,542 to Steinbrecher; the instantaneous direction of arrival of the X aligned polarization component can be monitored. Simultaneously, the instantaneous direction of arrival of the Y aligned polarization component can also be monitored. This monitoring enables the matching of the two polarization components arriving from the same direction.

Based on the inventive technology of the Steinbrecher patents, it is therefore attainable and desirable to provide a method for continuously and simultaneously monitoring the independent polarization of multiple signals in a wideband radio frequency ensemble.

SUMMARY OF THE INVENTION

Accordingly, it is a primary object and general purpose of the present invention to provide a method for monitoring the instantaneous polarization of multiple wireless electromagnetic signals in a wide bandwidth.

To attain the object of the invention, an instantaneous polarization of a propagating electromagnetic radio frequency signal defines the orientation of the electric field vector as a function of time in a plane that is normal to the Poynting vector; thereby, defining the direction of electromagnetic energy propagation.

The pointing direction of the electric field vector can be dynamic or static to be in the plane. The pointing direction of the electric field vector is the polarization of the electromagnetic wave. Static polarization is generally referred to as being linear. Dynamic polarization is continuously changing and can be in numerous forms.

The common form of dynamic polarization is elliptical in that a tip of the polarization vector traces out an ellipse that is normal to the direction of propagation. The focus is detecting the actual instantaneous direction of the polarization vector when the vector is referenced to the coordinates of the planar surface.

In the method, an air interface aperture partitions each incident signal polarization vector into two components aligned with the X-Axis and the Y-Axis of the air interface. The partition elements partition an electric field of an incident radio frequency signal into two electrical field signals such that one signal has an electric field normal to a Y-Axis of the plane while a second signal has an electric field normal to an X-Axis of the plane. The two signals are linearly polarized and the magnitudes of the linear polarization vectors are the amplitudes of these two signals.

The X-components and the Y-components are separately analyzed to determine the frequency and the direction of arrival of each component. This method is reversible in that given the instantaneous magnitudes and phases of these two signals; the instantaneous polarization vector can be defined.

Although it is possible for a signal linear polarization vector to align with the X-Axis or the Y-Axis of the air interface; this occurrence will not affect the accuracy of the analysis. The likely occurrence is that each signal captured by the air interface will exhibit X and Y polarization vector components. These components are paired by observing the same direction of arrival for each of the two paired polarization vector components.

However, it is necessary to identify the pairs of signals, as an X-component and a Y-component, arriving from the same source. This identification is accomplished by determining the direction of arrival for a signal and matching one signal with a paired signal by noting that paired signals have the same direction of arrival even if the two signals have different frequencies. Thus, the polarized signal from a given target is partitioned into two linearly polarized signals by the partitioned aperture. The signal polarization is then reconstructed by pairing the two linearly polarized signal components arriving from the same direction. The end product is a third signal that represents an instantaneous polarization of one of the identified signal pairs. This derivation is the polarization vector.

The method of the present invention is unique in that the instantaneous polarization of multiple signals over a wide bandwidth can be independently analyzed and recorded for numerous purposes after storage and retrieval from interactive databases. Even exceptionally complex signal modulation concepts can be analyzed.

BRIEF DESCRIPTION OF THE DRAWINGS

Other objects, features and advantages of the present invention will be better understood of the following figures, which will be briefly described herein.

DETAILED DESCRIPTION OF THE INVENTION

Referring now to the drawings and again to the prior art of FIG. 1, FIG. 2, FIG. 3 and FIG. 4; a segmented air interface is shown having a planar array of partition elements (PE), vertically polarized radio frequency ports (VPP), horizontally polarized radio frequency ports (HPP) and terminated radio frequency ports (T). The partitioned array is indexed horizontally by "j" coordinates ranging from 1 to N and is indexed vertically by "i" coordinates ranging from 1 to M. The partition elements are located at odd values of i and odd values of j. The horizontally polarized radio frequency ports are located at even values of j and odd values of i while the vertically polarized radio frequency ports are located at odd values of j and even values of i.

Figure 1:
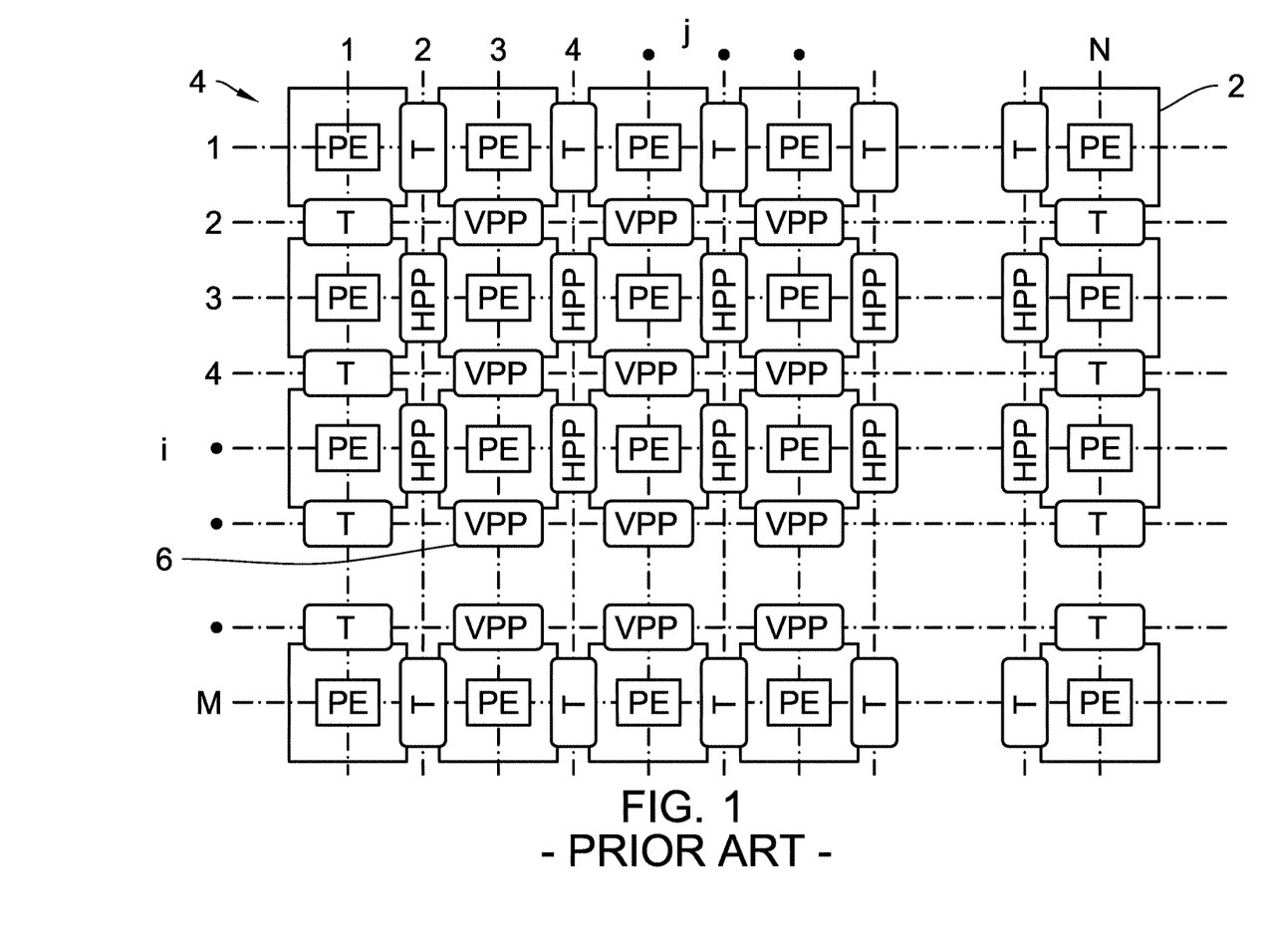
FIG. 1 depicts a prior art Eplane of partition elements used to resolve a signal polarization vector into orthogonal components aligned with an X-Axis and a Y-Axis with radio frequency ports positioned to capture scalar magnitudes of the orthogonal components.
Figure 2:
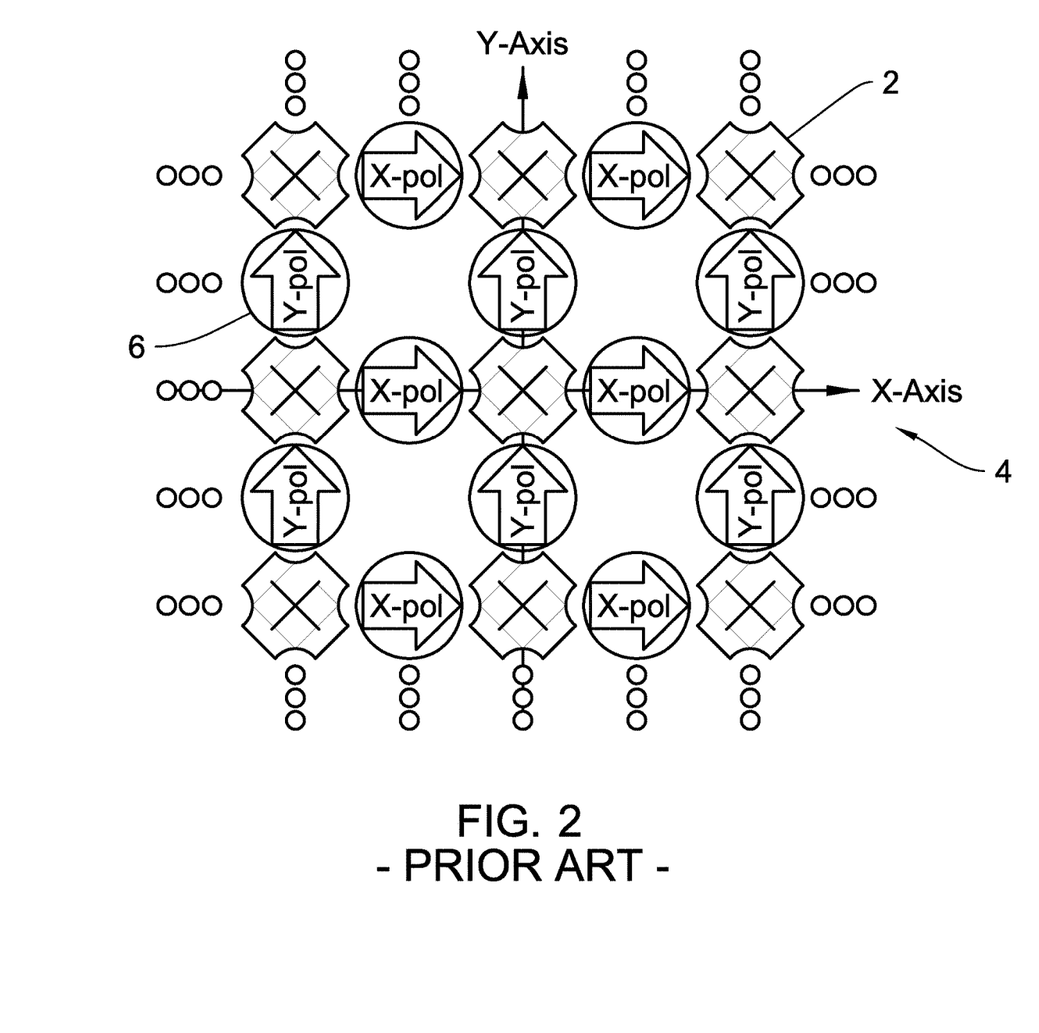
FIG. 2 depicts an alternate view of a prior art Eplane of partition elements used to resolve a signal polarization vector into orthogonal components aligned with an X-Axis and a Y-Axis.
Figure 3:
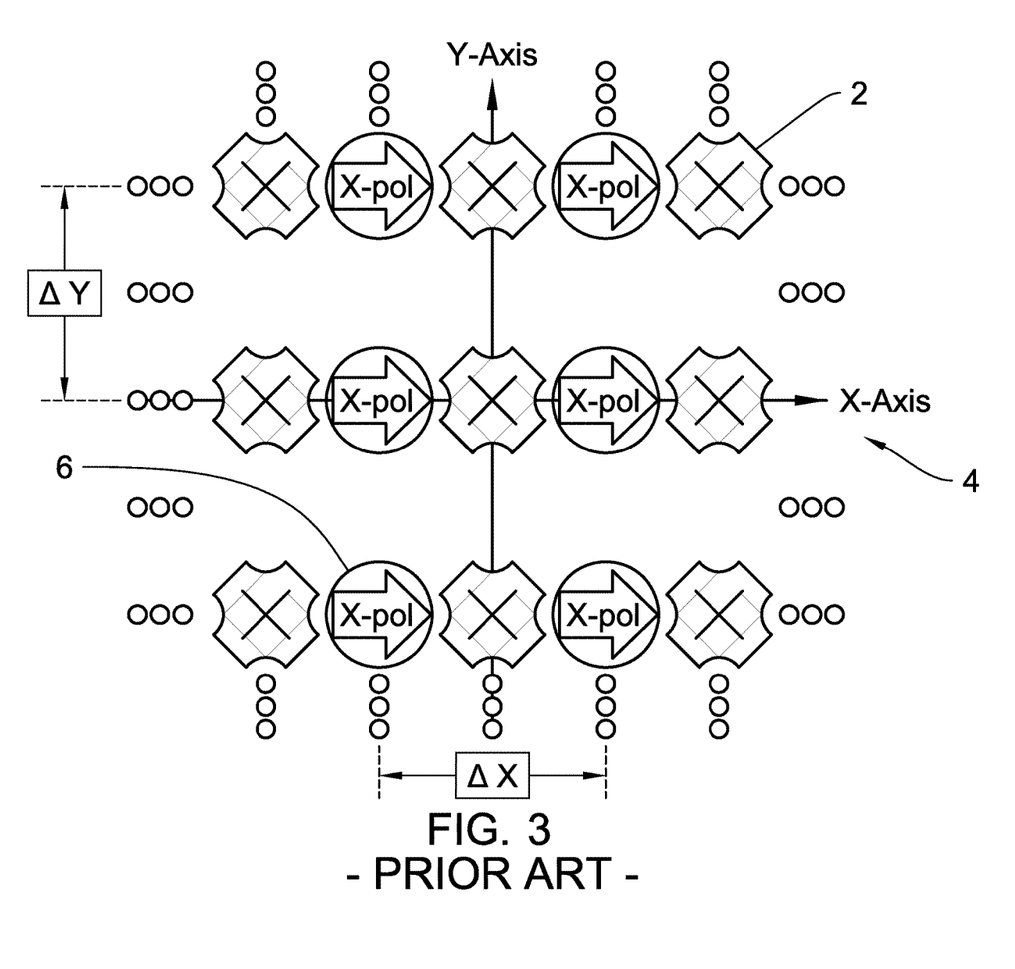
FIG. 3 is a prior art depiction of signal polarization components, captured by the radio frequency ports, that are aligned with the X-Axis of FIG. 1 and FIG. 2 in which the polarization components are digitally processed to resolve the frequency and instantaneous magnitudes and the direction of arrival of the polarization X-component of each captured signal.
Figure 4:
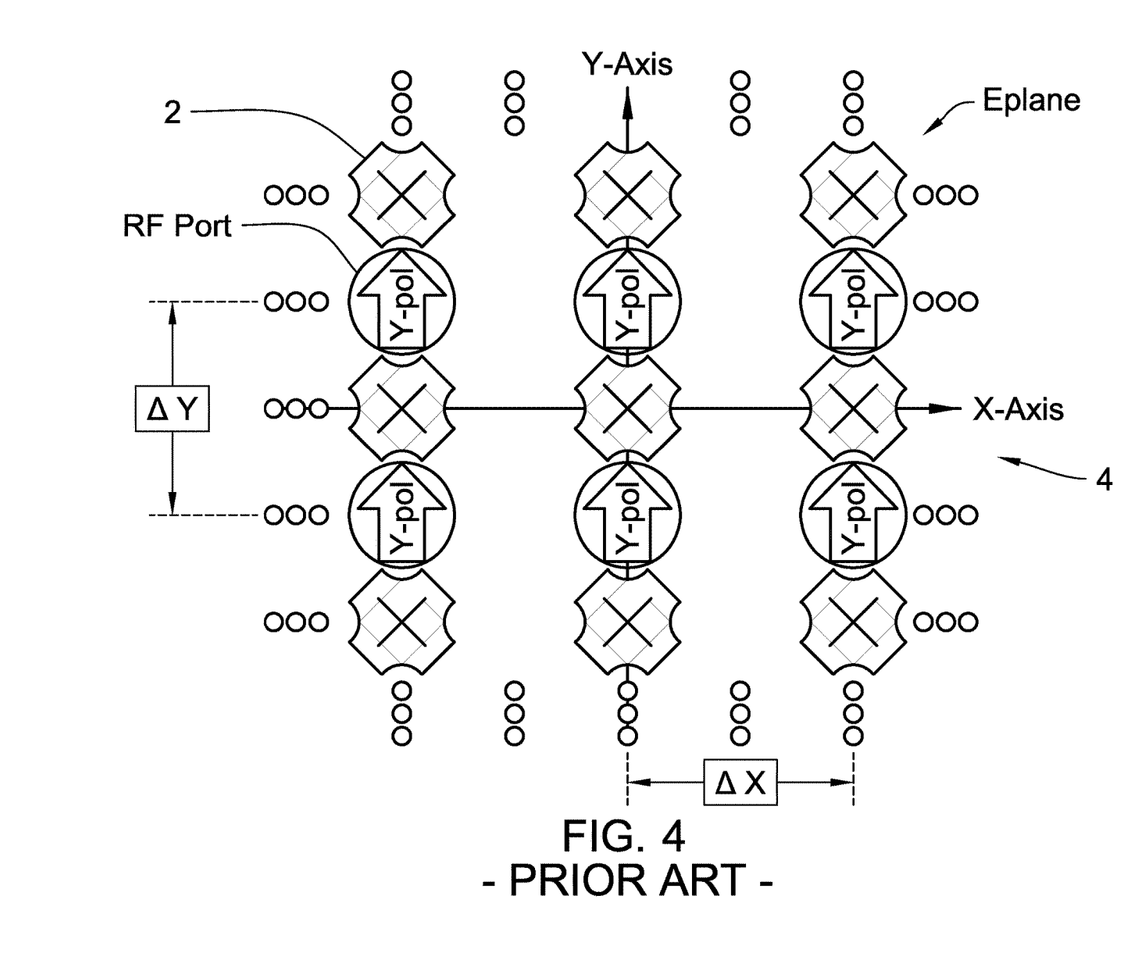
FIG. 4 is a prior art depiction of the signal polarization components, captured by the radio frequency ports, that are aligned with the Y-Axis of FIG. 1 and FIG. 2 in which the polarization components are processed to resolve the frequency and instantaneous magnitudes and the direction of arrival of the polarization Y-component of each captured signal.

The first electromagnetic signal air interface comprises a planar array of linearly polarized wireless sensors, each with a radio frequency (RF) port having a well-defined phase center. A first subarray of radio frequency ports 6 is aligned with the X-Axis of the Eplane 4. The first subarray of radio frequency ports 6 are each labeled 'X-pol' to indicate that the radio frequency ports collect the polarization vector component that is aligned with the X-Axis of the Eplane 4.

Each radio frequency port of the second subarray of radio frequency ports 6 is aligned with the Y-Axis of the Eplane 4. The second subarray of radio frequency ports 6 are each labeled 'Y-pol' to indicate that the radio frequency ports collect the polarization vector component that is aligned with the Y-Axis of the Eplane 4. If the number of radio frequency ports 6 in each array is equal to or greater than four; then each array can function as a direction of arrival system in which two angles defining the direction of arrival are evaluated by a digital signal processing algorithm as described in Steinbrecher (U.S. Pat. No. 10,001,542) and incorporated herein by reference.

The direction of linear polarization of the first air interface defines the X-Axis of a polarization plane and the X-Axis component of instantaneous polarization of each arriving signal is the vector dot product of the signal polarization vector and an X-Axis unit vector. This component is designated the 'X-pol' component and the result of the direction of arrival analysis is designated as the 'X-pol-DOA'.

A second electromagnetic signal air interface comprises a planar array of "M" linearly polarized wireless sensors, each with a radio frequency port having a well-defined phase center. If M is equal to or greater than four; then the planar array can function as a direction of arrival system in which two angles defining the direction of arrival are evaluated by a digital signal processing algorithm as defined in U.S. Pat. No. 10,001,542 to Steinbrecher.

The direction of linear polarization of the second air interface defines the Y-Axis of a polarization plane and the Y-Axis component of instantaneous polarization of each arriving signal is the vector dot product of the signal polarization vector and the Y-Axis unit vector. This component is designated the 'Y-pol' component and the result of the direction of arrival analysis is designated as the 'Y-pol-DOA'.

A first linearly polarized electromagnetic signal air interface, designated the 'X-pol-AI', and a second linearly polarized electromagnetic signal air interface, designated the 'Y-pol-AI' may be co-located or spatially separate provided that the linear polarizations of the two air interfaces are orthogonal to the received signals of interest.

It should also be noted that this method also applies by symmetry to the transmission of signals with arbitrary polarization modulation. Furthermore, the X-pol-AI and the Y-pol-AI may be identical (except for name and orientation) and arranged in the same plane with orthogonal linear polarizations that define the X-Axis and the Y-Axis of a polarization plane.

It is assumed that the location of the first air interface and the location of the second air interface are arranged so that the wireless electromagnetic signal illumination intensity is the same for both interfaces. This illumination intensity is physically possible when the signal source is in the far field.

For the purpose of this description, no loss of generality is incurred by using the Eplane configuration of the prior art figures. Thus, this description will use, as a model, the Eplane 4 of an X-pol array of RF ports and a Y-pol array of radio frequency ports. It is assumed that the number of X-pol RF ports and Y-pol RF ports are approximately equal and each is larger than four.

Figure 5:
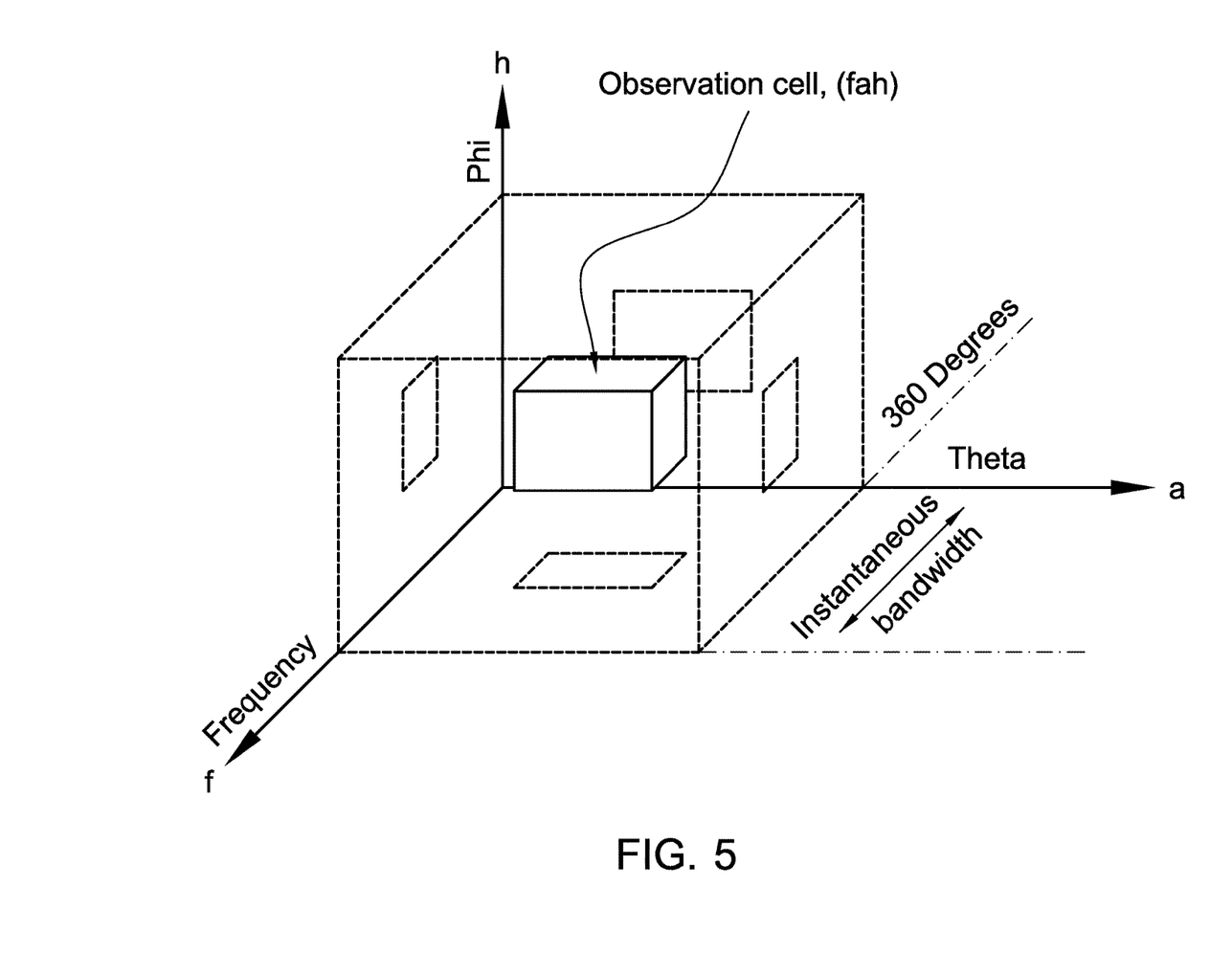
FIG. 5 graphically depicts the polarization X-component and Y-component of a signal of interest being logged for observation in a digital database of a processor and where signal polarization components having the same frequency and direction of arrival are paired for further processing.

As shown in FIG. 5, Phi and Theta are two angles that determine the direction of arrival of an observed radio frequency emission. The direction of arrival is specified in terms of the coordinates of an X-Y plane. The direction of arrival may be illustrated as a vector pointing to the origin of the X-Y plane. The angle, Theta, is measured counter-clockwise from the negative X axis to the normal projection of the direction of arrival vector onto the X-Y plane. The angle, Phi, is the elevation of the direction of arrival above the X-Y plane.

Figure 6:
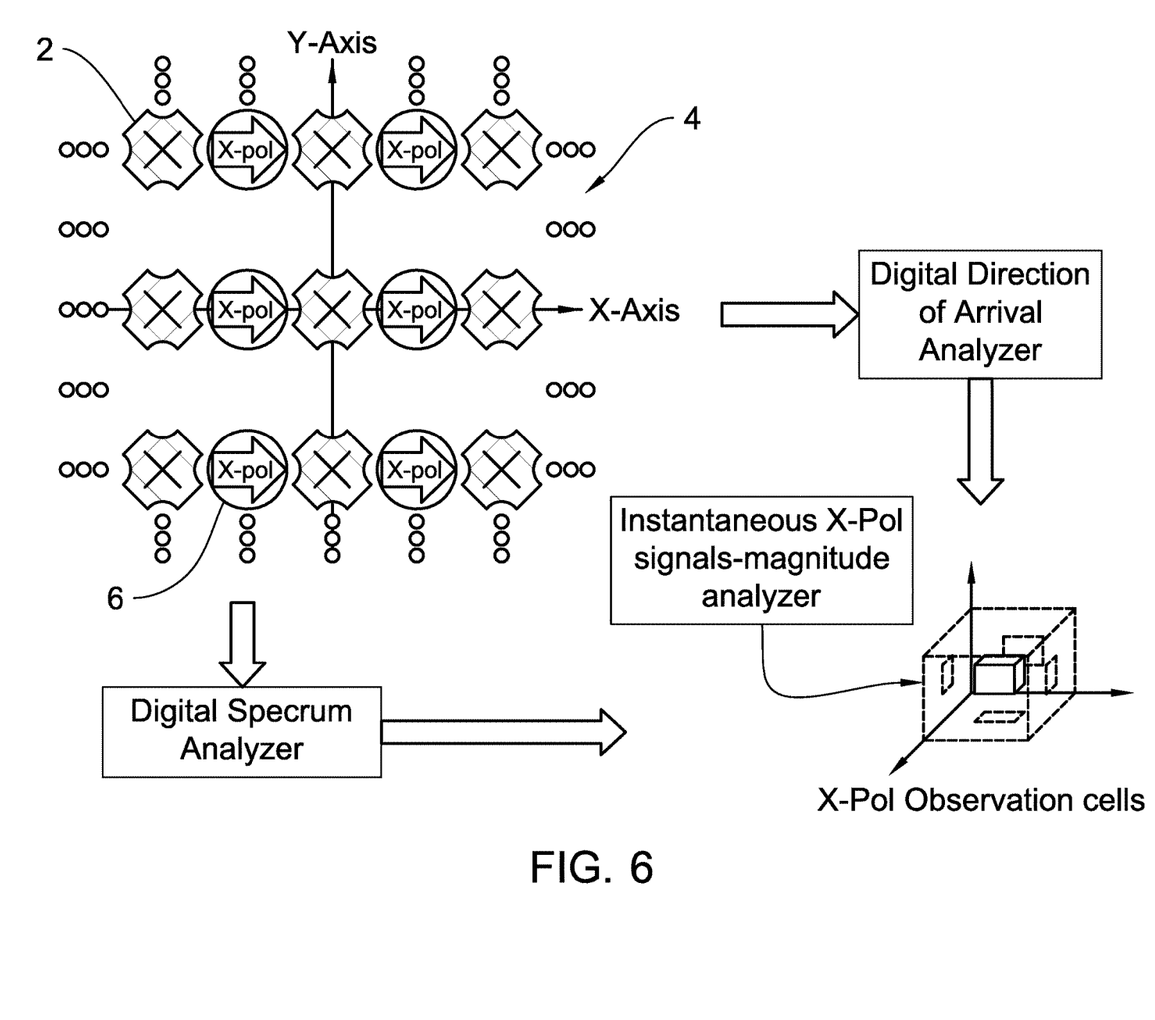
FIG. 6 depicts digital signal processing functions in which the signal family of the X-Pol RF Port group is analyzed by a spectrum analyzer to determine the frequency of each signal and by a direction of arrival analyzer to determine the Theta and Phi values for each signal of interest in order to define the coordinates of an observation cell for each signal of interest.
Figure 7:
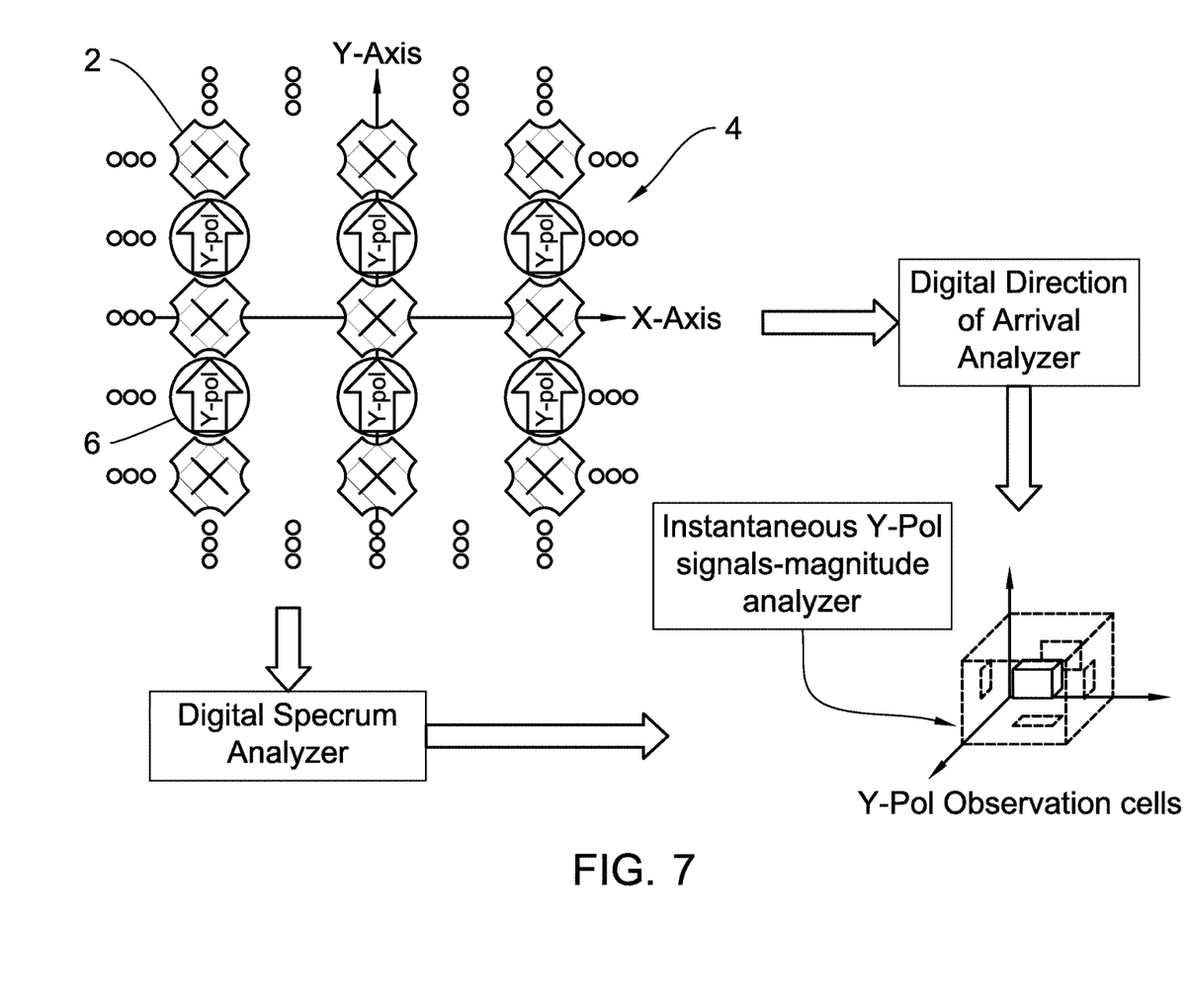
FIG. 7 depicts digital signal processing functions in which the signal family of the Y-Pol RF Port group is analyzed by a spectrum analyzer to determine the frequency of each signal and by a direction of arrival analyzer to determine the Theta and Phi values for each signal of interest in order to define the coordinates of an observation cell for each signal of interest.

Independent, but functionally identical, signal processing algorithms process the X-pol array of signal amplitudes as illustrated in FIG. 6 and the Y-pol array of signal amplitudes as illustrated in FIG. 7. The algorithms are described in U.S. Pat. No. 10,001,542 by Steinbrecher and as previously stated, are incorporated herein by reference.

The direction of arrival is determined by measuring the phase difference of an observed emission at pairs of radio frequency ports located on a plane. At least four radio frequency ports compute the two angles for a single emission. It is assumed that there are many more than four radio frequency ports in each of the X-pol and the Y-pol radio frequency port sets so that an accurate direction of arrival can be determined for each X-pol emission and separately for each Y-pol emission. It is highly likely that an X-Pol emission and a Y-Pol emission having the same direction of arrival are being generated by the same emitter even if the X-Pol emission and the Y-Pol emission have different frequencies.

The direction of arrival is specified by the two angles that are measured relative to the X and Y coordinates of the planar surface. It is not important which two angles are used as long as the direction of arrival determined for the X-pol radio frequency port set and the direction of arrival determined for the Y-pol set are unique and can be compared to identify the X-pol radio frequency signals and the Y-pol radio frequency signals that have the same direction of arrival with no ambiguity.

Referring again to FIG. 5, each observed radio frequency signal polarization parameter is identified by a cell with three unique dimensions in a cube with normalized dimensions that are determined by the total observation space and the system resolution requirements. The normalized dimensions are: frequency "f" and the two angles defining the direction of arrival; the angle Theta designated by the coordinate "a" and the angle Phi designated by the coordinate "h". The associated signal polarization parameter is therefore defined by the subscript "fah".

In an ideal system, the fah coordinates would identify a single point. In a practical system, such as the system disclosed herein, each of the three parameters have an extent depending on the accuracy of the observation. As a result, the cell identifying an observed polarization fah parameter will occupy a cube with dimensions determined by the accuracy of the observation.

Figure 8:
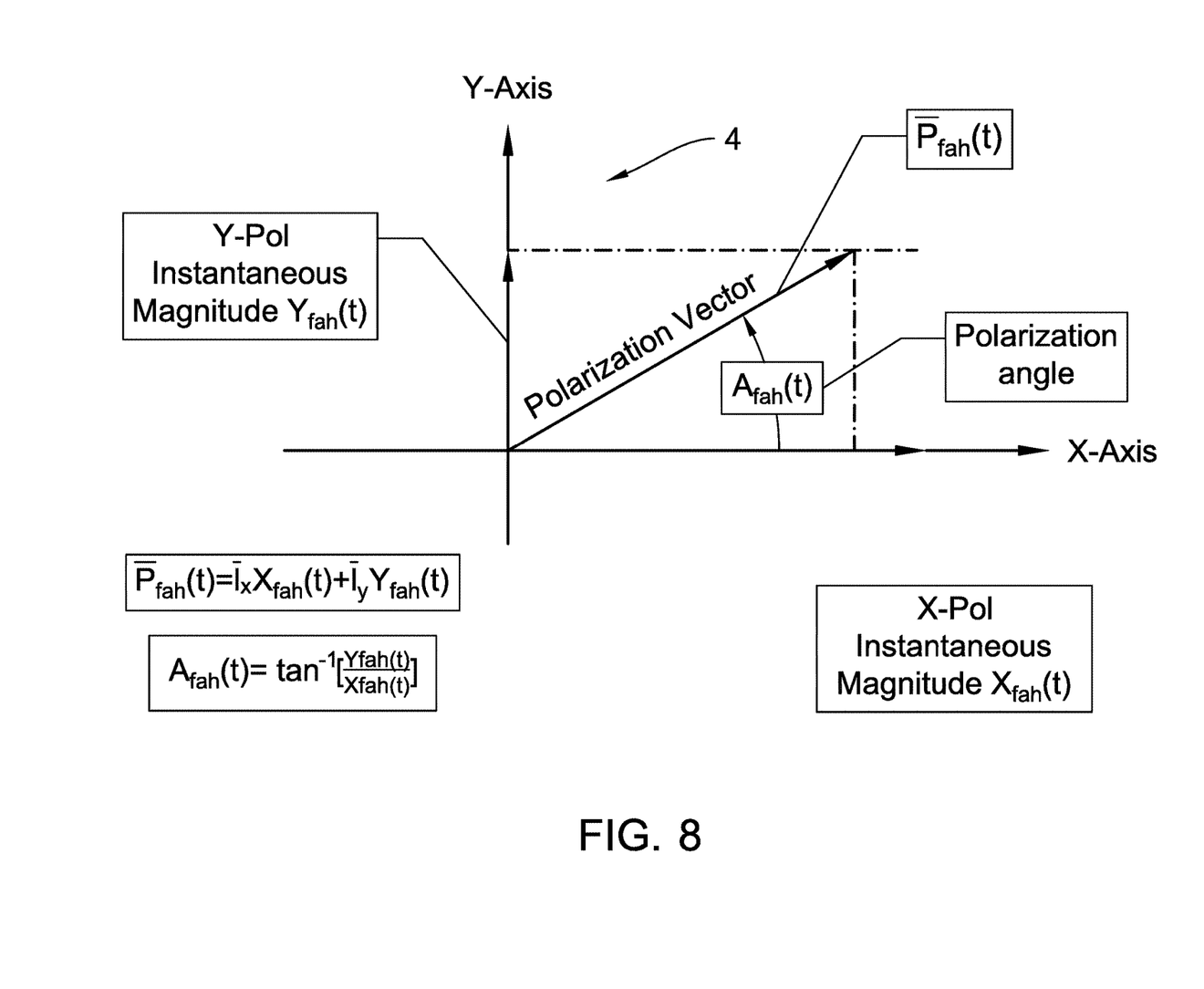
FIG. 8 depicts a mathematical method with a resultant graphical determination for combining X and Y polarization component magnitudes to obtain the properties of an incident polarization vector associated with an incident signal of interest in which the partition elements resolve the polarization vector and angle of each signal of interest into two orthogonal component vectors aligned with the X-Axis and Y-Axis.

As illustrated in FIG. 8, the instantaneous dimension of the polarization parameter $X_{fah}(t)$ or $Y_{fah}(t)$ is the scalar distance from the origin of the fah matrix space to the center of the $X_{fah}(t)$ or $Y_{fah}(t)$ cell. The instantaneous polarization analyzer of FIG. 9 combines the $X_{fah}(t)$ and $Y_{fah}(t)$ scalar magnitudes aligned with the X-Axis and the Y-Axis respectively to obtain the instantaneous polarization vector $P_{fah}(t)$.

A frequency and two angles specifying the direction of arrival are evaluated for each X-pol signal component and also for each Y-pol signal component. X-pol signal components are paired with Y-pol signal components having the same direction of arrival in order to determine the instantaneous polarization associated with each signal captured by the Eplane aperture.

The independent parameters in FIG. 8 are the X-pol instantaneous magnitude at time "t" and the Y-pol instantaneous magnitude at the same time. Assume that there is only one externally produced signal of interest "$s_z(t)$", illuminating the Eplane aperture. The partition elements segment $s_z(t)$ into two externally produced and separate signals "$s_{zx}(t)$" and "$s_{zy}(t)$"; the first of which is captured by the X-Pol subarray of radio frequency ports and the second of which is captured by the Y-Pol subarray of radio frequency ports.

Independently, a direction of arrival for X is determined for $s_{zx}(t)$ and a second direction of arrival for Y is determined for $s_{zy}(t)$. The expected value of the direction of arrival for X is the same as the expected value of the direction of arrival for Y because, in this degenerative case, only one signal is assumed to be present.

In the figure and restated here to apply to Equation (1), the direction of arrival is specified by the angles, Theta and Phi, abbreviated respectively by "a" and "h". In addition, a signal of interest is characterized by a frequency, which is designated by "f". The polarization of a signal of interest is a vector having a magnitude and phase at each instant in time. The instantaneous polarization vector is the vector sum of X and Y components aligned with the X and Y axes of a partitioned aperture plane. The X component is designated $X_{fah}(t)$ and the Y component is designated $Y_{fah}(t)$. The resulting polarization vector, using Equation (1), is:

$$\overline{P}_{fah}(t) = \overline{i}_x X_{fah}(t) + \overline{i}_y Y_{fah}(t) \quad (1)$$

The unit vectors $i_x$ and $i_y$ are aligned with the X-Axis and Y-Axis of the Eplane 4. The bars over the unit vectors indicate that there is a direction determined by the X and Y axes of the Eplane 4. The terms $X_{fah}(t)$ and $Y_{fah}(t)$ are scalar magnitudes.

The scalar magnitude of the polarization vector $\overline{P}_{fah}(t)$ is the square root of the sum of the squares of $|X_{fah}(t)|$ and $|Y_{fah}(t)|$. Since $\overline{P}_{fah}$ is a vector angle; it also has an associated angle which is designated as $A_{fah}(t)$. The magnitude of $A_{fah}(t)$ is the arc tangent of the ratio of $|Y_{fah}(t)|$ to $|X_{fah}(t)|$ as applied in FIG. 8 and FIG. 9. Vector math to interpret the illustration in the figure is well known in the art.

When multiple signals are detected by the aperture of the Eplane 4; the X components and the Y components are paired having the same "fah" values. The X components and the Y components are paired with the polarization analyzer. The polarization detection then proceeds on each pair individually. There is no significant interaction among the pairs of interest.

Figure 9:
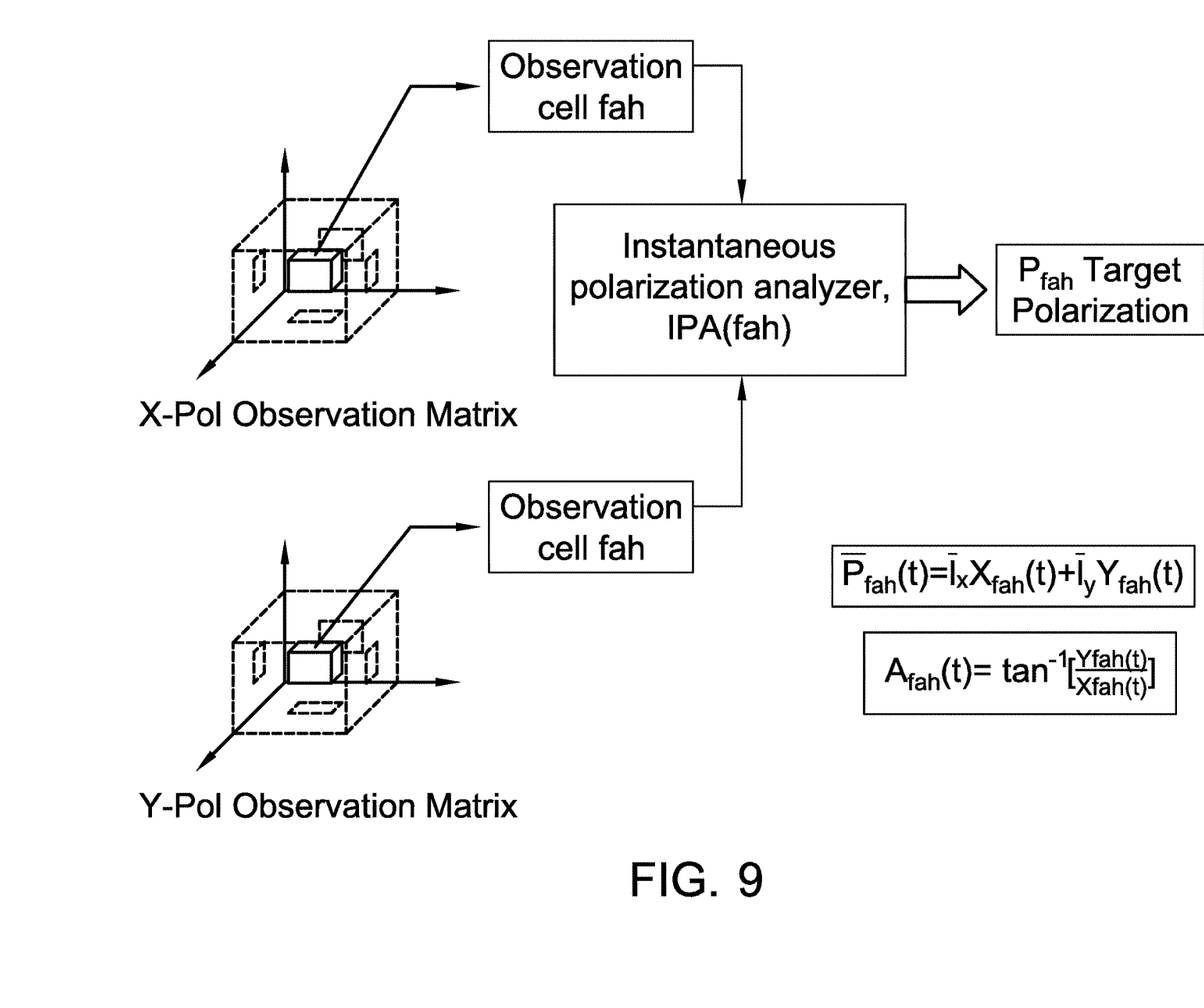
FIG. 9 depicts an instantaneous polarization analyzer in which inputs to the polarization analyzer are magnitudes of one X-Pol observation and one Y-Pol observation with the same frequency and direction of arrival such that the output of the polarization analyzer is the target polarization for each signal of interest in the aperture field of view.

As shown in FIG. 9, the instantaneous polarization analyzer (IPA) combines the $X_{fah}(t)$ and $Y_{fah}(t)$ scalar magnitudes aligned with the X-Axis and the Y-Axis respectively to obtain the magnitude of a planar vector Pfah(t) in X-Y space. The process of combining two orthogonal scalar magnitudes aligned with the X-Axis and the Y-Axis to obtain the magnitude of a planar vector at a specific angle in the X-Y plane is a known vector math step.

The vector magnitude is the square root of the sum of the squares of the two scalar components aligned with the X-Axis and the Y-Axis, respectively. The direction angle of the resulting vector is measured clockwise from the positive X-Axis and has a magnitude determined by the Arc Tangent of the ratio of the Y scalar to the X scalar, which is written in Equation (2) as $$\text{ATan}(Y_{fah}(t)/X_{fah}(t)) \quad (2)$$

In an automated scenario, the instantaneous polarization analyzer can form a sequence of a set of specified $X_{fah}(t)$ being observed and pair the elements of the sequence with $Y_{fah}(t)$ scalar magnitudes having the same fah values; which will result in sorting the data sets into a new data set having pairs of scalar magnitudes having the same fah values. These pairs are then processed to obtain the polarization vector magnitude and phase determined by each fah pair.

It is common in systems of this type to use digital buffers to store the information until it is usable for an intended purpose. For example, an observation may be focused on the rapidly changing instantaneous polarization of a single emission source identified by a unique fah combination that is slowly changing as the direction to the emission source from the observation point slowly changes.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A method for resolving an instantaneous polarization of a plurality of electromagnetic signals, said method comprising the steps of:

providing a segmented X-Y plane populated with at least eight linearly polarized radio frequency ports such that polarization of four of the radio frequency ports is aligned with an X coordinate of the plane and polarization of four of the radio frequency ports is aligned with a Y coordinate of the plane;

identifying each of the radio frequency ports as being an X-pol radio frequency port depending on whether a linear polarization is aligned with the X coordinate of the segmented X-Y plane;

identifying each of the radio frequency ports as being an Y-pol radio frequency port depending on whether a linear polarization is aligned with the Y coordinate of the segmented X-Y plane;

receiving a first radio frequency signal at a plurality of radio frequency ports of the segmented X-Y plane;

receiving a first X polarized radio frequency signal component at a plurality of the X-pol radio frequency ports;

determining a direction of arrival of the first X polarized radio frequency signal component;

receiving a first Y polarized radio frequency component at a plurality of Y-pol radio frequency ports;

determining a direction of arrival of the first Y polarized radio frequency signal component;

verifying that the direction of arrival of the first Y polarized radio frequency signal component matches the direction of arrival the first Y polarized radio frequency component;

verifying subsequent to said verifying the direction of arrival step that the first Y polarized radio frequency component and the first Y polarized radio frequency component originate from a same source such vectors of each can be combined to determine a polarization vector of a first radio frequency source;

identifying the first pair of radio frequency ports;

receiving a second signal with a second pair of the radio frequency ports;

identifying the second pair of radio frequency ports;

providing rectangular coordinates of positions of radio frequency port phase centers of the plane of segmented apertures such that X coordinates are aligned with a horizontal direction and Y coordinates are aligned with a vertical direction wherein the first pair of radio frequency ports and the second pair of radio frequency ports relate to the radio frequency port phase centers and are uniformly spaced on the X coordinates and the Y coordinates of the plane; and identifying a radio signal arrival direction from the first pair of radio frequency ports and the second polarization from the second pair of radio frequency ports as specified by angles, theta $\theta$ and phi $\varphi$ wherein the angle theta is measured clockwise from a negative X axis of the plane and the angle phi is a measure of elevation from the X-Y plane;

wherein said method is capable of independently resolving the direction-of-arrival of each orthogonal vector component of each signal of interest in a cohort of signals captured by the partitioned aperture.

2. The method in accordance with claim 1, wherein said method further comprises the step of pairing orthogonal polarization vector components by direction of arrival such that at least orthogonal vector components will have a same direction of arrival.

3. The method in accordance with claim 1, wherein said method further comprises the step of processing at least two orthogonal polarization vector components that are captured by the partitioned aperture and originate from the same direction of arrival in order to resolve the instantaneous polarization of a composite signal of interest with vector components having the same direction of arrival.

4. The method in accordance with claim 1, wherein the signal processing system is capable of processing at least two orthogonal polarization vector components that are captured by the partitioned aperture and originate from the same direction of arrival in order to resolve the instantaneous polarization of the composite signal of interest with vector components having the same direction of arrival;

wherein said method is capable of independently resolving the direction-of-arrival of each orthogonal vector component of each signal of interest in the cohort of signals captured by the partitioned aperture.

\* \* \* \* \*